INVENTOR
JACK AVINS
BY Eugene M. Whitacre
ATTORNEY

INVENTOR
JACK AVINS

BY Eugene M. Whitacre
ATTORNEY

United States Patent Office 3,444,477

Patented May 13, 1969

3,444,477

AUTOMATIC FREQUENCY CONTROL APPARATUS ESPECIALLY SUITABLE FOR INTEGRATED CIRCUIT FABRICATION

Jack Avins, Princeton, N.J., assignor to Radio Corporation of America, a corporation of Delaware Continuation-in-part of application Ser. No. 620,006, Mar. 2, 1967. This application June 26, 1967, Ser. No. 648,667

Int. Cl. H03b 3/08

U.S. Cl. 331—8 33 Claims

ABSTRACT OF THE DISCLOSURE

Automatic frequency control circuitry especially suitable for fabrication using integrated circuit techniques includes a pair of symmetrical detector networks driven from a common phase-shift circuit to provide push-pull voltages to the opposite sides of a differential amplifier, an output voltage of which is indicative of the frequency deviation of a heterodyned signal from a predetermined reference frequency and is used to control a variable reactance device included in a local oscillator unit employed in providing the heterodyning function.

This is a continuation-in-part of application Ser. No. 620,006, filed Mar. 2, 1967, now abandoned.

This invention relates to improved automatic frequency control (AFC) apparatus. More particularly, it relates to such apparatus for deriving a frequency dependent error correction voltage to control the tuning of a local oscillator in a superheterodyne receiver, and which can be fabricated using integrated circuit techniques.

As used herein, the term "integrated circuit" refers to a unitary or monolithic semiconductor device or chip which is the equivalent of a network of interconnected active and passive circuit elements. At the present state of the art, there exists no satisfactory way of providing an inductor or a potentiometer, on an integrated circuit. In addition, capacitors require a large area of the integrated circuit chip, even to provide a very small capacitance; and due to the limitations of present fabrication techniques, capacitors may represent a potential source of trouble due to the incidence of shorting of the capacitor plates.

It is an object of the present invention to provide automatic frequency control circuitry which can be fabricated using integrated circuit techniques.

As will become clear hereinafter, automatic frequency control apparatus embodying the invention and used in superheterodyne receivers includes a pair of oppositely poled detector networks. These networks may be of the type disclosed in pending application Ser. No. 530,480, filed Feb. 28, 1966 and entitled "Signal Translating System." The detectors are driven by a phase-shift transformer which is external to the integrated chip and which is tuned to the video carrier in the intermediate frequency band, and are arranged to provide push-pull drive to a differential amplifier formed on the chip. Changes in the frequency of the video carrier frequency at the discriminator networks produce error signal correction voltages in the differential amplifier which, when applied to a voltage responsive reactance device, are effective to control the frequency of the local oscillator of the superheterodyne receiver.

The novel features that are considered characteristic of the invention are set forth in the appended claims. The invention itself, however, both as to its organization and method of operation, will best be understood when read in connection with the accompanying drawings in which:

While the integrated circuit of the invention will be described in the context of a television receiver, it will be understood that its fundamental concepts are more generally applicable, being useful in broadcast or communication receivers for example.

When a television viewer rotates the channel selector and adjusts the fine tuning control of his receiver, he is actually varying the frequency of a local oscillator in the television tuner. The signal output of this oscillator is heterodyned with the composite television signal received at the antenna and amplified in the radio frequency stage. This action creates both the sum and difference frequencies, as well as the original local oscillator and radio frequencies, but all but the difference frequencies are filtered out. The remaining difference, or intermediate, frequencies are amplified and detected in the normal manner to recreate the desired audio and video information. If the local oscillator is for any reason not set at the proper frequency, the intermediate frequencies will be incorrect, and may deleteriously affect the reproduced sound and picture. As is well known, this mis-tuning may be due to improper fine tuning by the television viewer, local oscillator drift, or inaccurate resettability of the mechanical detenting action of the tuner.

The schematic circuit diagrams of the drawings show examples of specific circuitry embodying the automatic frequency control apparatus of the invention. The apparatus operates as a frequency discriminator to develop a control voltage which is representative of the sense and degree that the resultant intermediate frequency signal departs from the desired intermediate frequency signal. The control voltage is applied to a voltage responsive reactance device in the local oscillator of the television receiver to correct the mistuning of the oscillator and optimize the sound and picture reproduction.

Figures 1, 2:
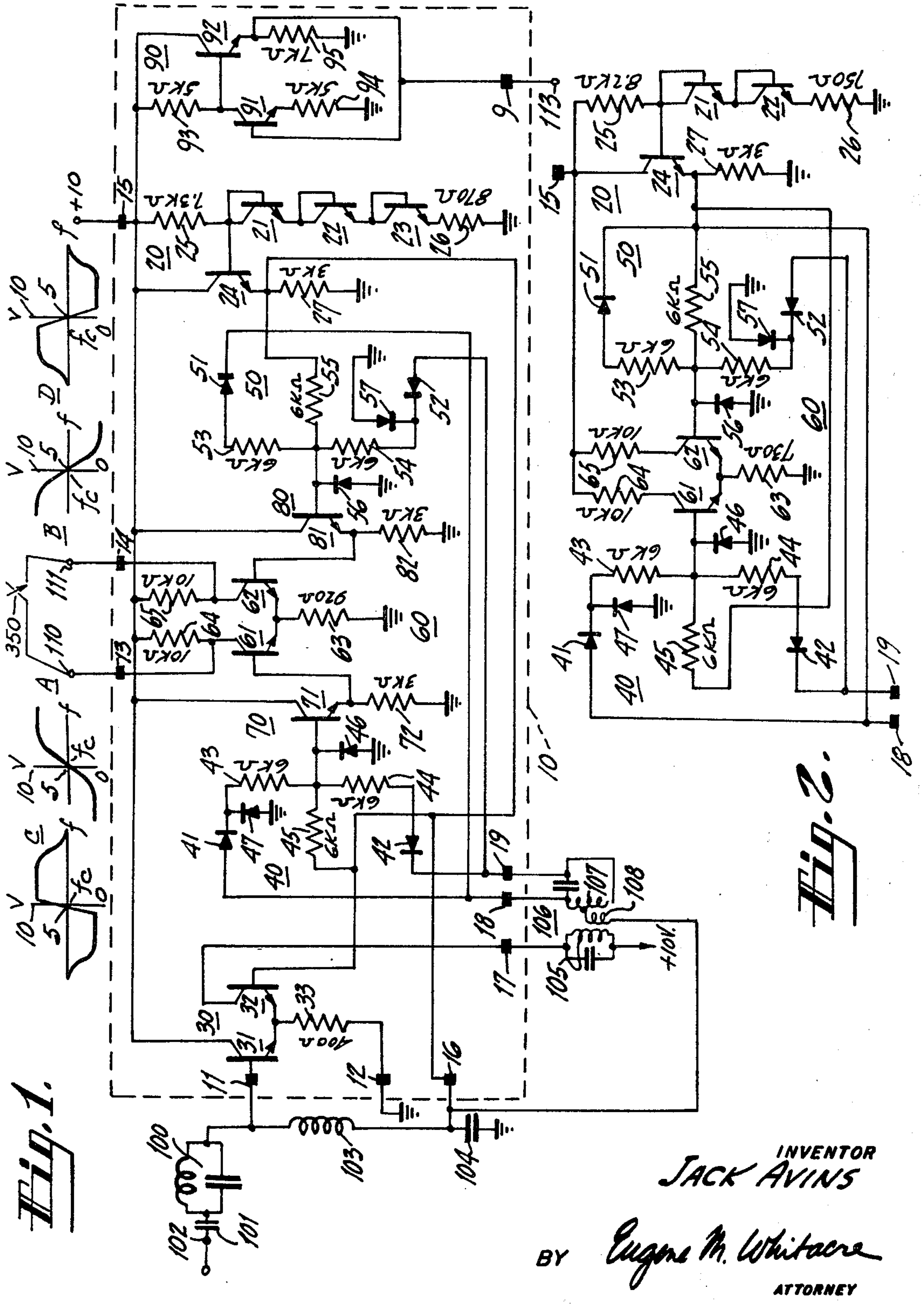
FIGURE 1 is a schematic circuit diagram of automatic frequency control circuitry embodying the present invention.
FIGURE 2 is a partial schematic circuit diagram of a modification of the circuitry of FIGURE 1.

The dashed rectangle 10 in FIGURE 1 of the drawings schematcially illustrates a monolithic semiconductor chip. The chip has a plurality of contact areas about its periphery, through which external connections to the circuits on the chip can be made. For example, the chip 10 has a pair of contact areas 11 and 12 which are coupled to a source of intermediate frequencies. The contact area 12 provides a common or ground potential contact area, which is connected to the various circuit-ground connections shown on the monolithic chip. As to physical dimensions, the chip 10 may be of the order of 50 mils x 50 mils, or smaller. The manner of implementing the various transistor, diode and resistor functional portions described below in a monolithic chip is known in the art, one such method, for example, being illustrated by Patent No. 3,271,685, issued Sept. 6, 1966.

For ease of understanding, the automatic frequency control apparatus on the integrated chip 10 may be considered to be comprised of five stages: a voltage supply 20, a buffer amplifier 30, a pair of oppositely poled detectors 40 and 50, and a differential amplifier output stage 60. Intermediate frequency signals are supplied to the chip 10 by means of the contact areas 11 and 12 while direct current control signals indicative of their deviations from a reference frequency are derived at the differential amplifier contact areas 13 and 14.

The voltage supply 20 includes diodes 21, 22 and 23, transistor 24, and resistors 35, 26 and 27. Diodes 21–23 are serially connected between resistors 25 and 26, and poled so as to conduct current from resistor 25 to resistor 26. The end of resistor 25 remote from diode 21 is connected via a contact area 15 to a source of potential (not shown), and the end of resistor 26 remote from diode 23 is connected ground. The junction between resistor 25 and diode 21 is connected to the base electrode of transistor 24, the collector and emitter electrodes of which are respectively connected directly to the contact area 15 and via resistor 27 to ground. It will be noted that diodes 21–23 are shown as being fabricated from a transistor structure rather than from a rectifier structure. This technique, wherein the collector and base regions are interconnected to form the anode of the diode while the emitter region forms the cathode of the diode, is employed to minimize any parasitic transistor action in the rectifier structure.

The voltage developed across resistor 27 in the supply 20 is used to bias the buffer amplifier 30 and the differential amplifier 60. With a plus 10 volt potential source and with the component values set forth in the drawing, this voltage is approximately plus 2.2 volts. (In this respect it should be pointed out that the voltage drop across each of the diodes 21–23 and the voltage drop across the base-to-emitter junction of transistor 24 is about 0.7 volt.) As will subsequently become clear, the bias voltage is applied to the differential amplifier 60 in such a manner that its current is independent of temperature variations.

The buffer amplifier 30 comprises an emitter coupled amplifier-limiter stage including a pair of transistors 31 and 32 and a resistor 33. The collector electrode of transistor 31 is connected to the potential source contact area 15 while the base electrode of transistor 32 is connected to the emitter electrode of transistor 24 in the voltage supply unit 20. The emitter electrodes of transistors 31 and 32 are connected together and to the ground contact area 12 through resistor 33. The base electrode of transistor 31 is connected by way of the contact area 11 to one end of a parallel resonant circuit 100, the other end of which is connected through a coupling capacitor 101 to an input signal terminal 102. Terminal 102 may represent the output circuit of the video intermediate frequency amplifier of a television receiver, in which case the resonant circuit 100 is tuned to 47.25 mHz. Such tuning is effective to pass the 45.75 mHz. intermediate frequency video carrier and to trap or reject the adjacent channel sound carrier in the intermediate frequency band. The base electrode of transistor 31 is also connected via the contact area 11, a signal decoupling choke 103 and a contact area 16 to the emitter electrode of transistor 24 in the voltage supply 20. This connection completes the bias circuit arrangement for the buffer stage 30. A signal bypass capacitor 104 couples the contact area 16 to ground.

The collector electrode of transistor 32 is connected through a contact area 17 to the primary winding 105 of a phase shift discriminator transformer 106 which is tuned to the 45.75 mHz. video carrier frequency. The secondary winding 107 of the transformer 106 is connected between a pair of contact areas 18 and 19, and is also tuned to 45.75 mHz. A tertiary winding 108 is connected between a centertap on the secondary winding 107 and the contact area 16.

The detector network 40 includes a pair of oppositely poled diodes 41 and 42. It also includes a pair of load resistors 43, 44 connected in series between the cathode electrode of the diode 41 and the anode electrode of the diode 42. The anode electrode of diode 41 and the cathode electrode of diode 42 are respectively connected to the contact areas 18 and 19 to form a series circuit including the tuned secondary winding 108. The detector 40 further includes a third resistor 45 connected between the junction of resistors 43 and 44 and the emitter electrode of the voltage supply transistor 24.

The detector network 50 similarly includes a pair of oppositely poled diodes 51 and 52 and a pair of load resistors 53 and 54 serially connected with the secondary winding 108. More particularly, the cathode electrode of the diode 51 is connected to the contact area 18, the anode electrode of the diode 52 is connected to the contact area 19, the anode electrode of the diode 51 is connected to one end of the resistor 53, and the cathode electrode of the diode 52 is connected to one end of the resistor 54. The detector 50 likewise includes a third resistor 55 connecting the other ends of the resistors 53 and 54 to the emitter electrode of transistor 24.

The detector networks 40 and 50 are of the kind disclosed in pending application Ser. No. 530,480, filed Feb. 28, 1966, and entitled, "Signal Translating System." As is therein described, the illustrated construction does away with the need for the large capacitors normally used in prior art detectors and eliminates the known problems large capacitors present to integrated circuit design. At the same time, such construction permits the use of a relatively small amount of capacitance to filter the applied signals. That capacitance, for example, may be provided in FIGURE 1 by the distributed capacitance of the load resistors 43 and 44 for the detector 40, and 53 and 54 for the detector 50.

The differential amplifier 60 includes two transistors 61 and 62 and three resistors 63, 64 and 65. The emitter electrodes of the transistors 61 and 62 are connected together and to ground by way of resistor 63. The collector electrodes of these transistors are each connected to the contact area 15, the collector electrode of the transistor 61 through the resistor 64 and the collector electrode of the transistor 62 via the resistor 65. These electrodes are also respectively connected to output terminals 110 and 111 by means of the contact areas 13 and 14.

Emitter follower circuits 70 and 80 respectively couple the base electrodes of the transistors 61 and 62 to the detector circuits 40 and 50. The circuit 70 includes a transistor 71 having an emitter electrode connected to ground through a resistor 72, a base electrode connected to the junction of resistors 43 and 44 in the detector 40, and a collector electrode connected to the potential source contact area 15. The circuit 80 similarly includes a transistor 81 having an emitter electrode referenced to ground by way of resistor 82, a base electrode connected to the junction of resistors 53 and 54 in the detector 50, and a collector electrode connected to the contact area 15. The emitter electrode of transistor 71 is also connected to the base electrode of transistor 61 while the corresponding emitter electrode of transistor 81 is additionally connected to the base electrode of transistor 62.

The Ser. No. 530,480 application also describes the use of reverse biased diodes as small capacitors to augment the signal filtering provided by the detector network. One such diode 46 is included in the detector network 40. Its cathode electrode is connected to the junction of resistors 43 and 44 and its anode electrode is grounded. Another such diode 56 performs the additional filtering in the detector network 50. The diode 56 has its cathode electrode connected to the junction of resistors 53 and 54 and its anode electrode connected to ground.

The diodes 46 and 56 are reverse biased in the following manner. By returning the tertiary winding 108 to a positive voltage, 2.2 volts with respect to ground as shown in the drawing, the input electrodes of the diodes 41, 42, 51 and 52 are also raised to this voltage. Since the load impedance at the junction of the load resistors 43 and 44 is large relative to either of these two resistors, the same plus 2.2 volts appears at the junction of resistors 43 and 44 when the applied signal is at the center signal frequency and strong enough to drive the diodes 41 and 42 into conduction. The diode 46 is thus reverse biased by this amount. Since the detector circuits 40 and 50 are each symmetrical, the same set of conditions exist at center signal frequency for the resistors 53 and 54. The diode 56 is therefore reverse biased by the 2.2 volt potential established at the junction of resistors 53 and 54.

Each of the detector circuits 40 and 50, furthermore, include a second reverse biased diode; 47 in the case of the circuit 40 and 57 in the case of the circuit 50. These diodes provide symmetrical loading to the opposite ends of the secondary winding 107 of the discriminator transformer 106. More particularly, the diode 47, with its anode electrode connected to ground and its cathode electrode connected to the cathode electrode of the diode 41, adds a capacity to that exhibited by the anode region of the diode 41 so as to balance the higher capacity presented by the cathode region of the diode 51 to the secondary winding 107 at contact 18. Similarly, the anode and cathode electrodes of the diode 57 are respectively connected to ground and to the cathode electrode of the diode 52, to add a capacity to that exhibited by the anode region of the diode 52 so as to balance the higher capacity presented by the cathode region of the diode 42 to the winding 107 at contact 19. (In this respect, it will be understood that the anode and cathode regions of these diodes are constructed from P and N type semi-conductor material respectively.) Since an average direct current potential of about 1 volt is developed across each of the resistors 43 and 44 in the detector 40, and across each of the resistors 53 and 54 in the detector 50 due to rectification of the applied carrier signal, the diodes 47 and 57 are each reverse biased by about 3.2 volts.

The operation of the automatic frequency control apparatus of FIGURE 1 is as follows. Intermediate frequency signals of a nominal 45.75 mHz. frequency are applied to the terminal 102, and are coupled through the capacitor 101, the 47.25 mHz. resonant trap 100, and the contact area 11 to the buffer or emitter coupled amplifier 30. The buffer stage 30 amplitude limits the input signals so that the output current in the collector circuit of the transistor 32 is essentially a square wave. This wave is applied through the tuned primary and secondary windings of the phase-shift transformer 106 to the detector networks 40 and 50. As was previously mentioned, these networks provide an average type detection with a substantially resistive load.

The detector network 40 develops an output voltage which is proportional to the sine of the phase angle shift impaired by the discriminator transformer 106 to the signal wave developed across its secondary winding 107 with respect to the wave applied to its primary winding 105. This is described in the pending application Ser. No. 531,652, filed Feb. 28, 1966 and entitled "Signal Translating System," of which the Ser. No. 530,480 application represents an improvement. As is pointed out in that 531,652 application, the imparted phase angle shift is directly proportional to the frequency difference between the applied signal and the frequency to which the discriminator transformer is tuned (i.e., the center frequency). Where the applied signal is of a higher frequency than this center frequency, the phase shift and the output voltage are of positive value; conversely, where the applied signal is of a lower frequency, the phase shift and output voltage are negative.

The detector network 50, develops an output voltage which also is proportional to the sine of the imparted phase shift. That voltage, however, is of a polarity opposite to the voltage developed by the network 40. This follows because the two networks are oppositely poled, the direction of current flow in the detector 40 being from the high to the low side of the secondary winding 107 while it is just the opposite in the detector 50. Any frequency deviation of the applied signal from the center or reference frequency thus produces a change in the output voltage at the junction of resistors 43 and 44 in the network 40 which is equal in magnitude but in the opposite polarity direction to that produced at the junction of the resistors 53 and 54 in the network 50.

The resistors 45 and 55, respectively connected between the two above-mentioned junctions and the plus 2.2 volt supply 20, ensure balanced discriminator action over a wide range of applied signal levels. The function of this resistor is described in the Ser. No. 530,480 application, where it is noted that without such resistor connections, the discriminator characteristic would undergo a direct current voltage shift for low level signals. Such a voltage shift in this environment would impair the pull-in characteristics of the AFC apparatus.

The output voltages developed by the detector networks 40 and 50 are respectively coupled in push-pull relation through the emitter follower stages 70 and 80 to opposite sides of the differential amplifier 60. At the center frequency, equal voltages are applied to the opposite sides and the amplifier 60 exhibits a common mode gain equal to the ratio between the parallel equivalent of the load resistors 64 and 65 and the emitter coupling resistor 63. With the component values shown in FIGURE 1, this common mode gain is approximately six times. The particular values were selected so that the differential amplifier 60 would develop approximately 5.0 volts at both terminals 110 and 111 at center frequency. For applied signal frequencies different from the center frequency, the differential amplifier 60 exhibits a differential mode gain of about 100 times. (In this respect it will be understood that a common mode condition is characterized by signals of substantially equal amplitude and of the same polarity being applied to the opposite sides of the amplifier 60; a differential mode condition then exists when the applied signals are of substantially equal amplitude but of opposite polarity.)

As was previously mentioned, the detector output voltages applied to the sides of the differential amplifier 60 are equal in magnitude but opposite in polarity. Frequency deviations in one direction (e.g., increase) from the 45.75 mHz. center frequency cause positive voltages to be applied to the base electrode of the differential amplifier transistor 61 and negative voltages to be applied to the base electrode of the transistor 62. Conversely, frequency deviations in the other direction (e.g., decrease) from the 45.75 mHz. frequency cause negative and positive discriminator voltages to be respectively applied to the transistors 61 and 62.

The output voltage developed by the differential amplifier 60 as a function of signal frequency is shown in FIGURE 1 at the terminals 110 and 111. The voltage characteristics A and B are of the form of the well known discriminator characteristic or "S curve," with the output voltage being about 5 volts at the 45.75 mHz. center frequency $f_c$. Their 10 and zero volts maximum and minimum values were reached at approximately 50 kHz. deviation from that center frequency. The voltage characteristics C and D illustrate approximately a ±1 mHz. pull-in range for the apparatus. This range is established by the Q and the coupling of the discriminator transformer 106.

The voltages developed at the output terminals 110 and 111 of the differential amplifier 60 are used to control variable reactance circuitry in the local oscillator of the television tuner to control its frequency. In the case of a UHF tuner, the voltage developed at either one of these output terminals may be coupled in a known manner to change the capacitance exhibited by a varactor diode included in the frequency determining network of the oscillator. In the case of a VHF tuner, the voltages developed at these terminals may be coupled to the base and collector electrodes of a transistor included in the frequency determining network. Such an arrangement is disclosed in the pending application Ser. No. 619,745, filed Feb. 28, 1967, wherein it is described how, with the emitter electrode open circuited, the transistor exhibits the characteristics of a voltage variable capacitor. In either case, the voltage responsive capacity device is selected to adjust the oscillator frequency so as to set the intermediate frequency signal at 45.75 mHz. when the voltage developed at terminals 110 and 111 is plus 5 volts. FIGURES *5a* and *5b* may respectively represent these two alternative arrangements.

As was previously mentioned, one feature of the AFC configuration of the drawing is that the current flowing in the differential amplifier 60 is independent of temperature variations. Were this not so, the amplifier 60, having a differential gain of 100 or more, would produce an erroneous frequency control voltage of substantial proportion as the operating temperature changed. A similar situation would exist under conditions of varying supply voltage. The apparatus of FIGURE 1, however, is insensitive to such temperature and/or voltage supply variations.

Consider, first, a change in the environmental temperature. This causes the voltage drop across each of the diodes 21–23 in the voltage supply 20 to change by an amount $\Delta V_{be}$. Because the automatic frequency control apparatus is incorporated on a single monolithic chip 10, the voltage drop across the emitter-to-base junctions of the transistors 24, 61, 62, 71 and 81 also changes by $\Delta V_{be}$, and in the same direction as the change across the diodes 21–23. It will be apparent that the substantially $3\Delta V_{be}$ change at the base electrode of the transistor 24 due to this temperature variation is effectively offset by the individual $\Delta V_{be}$ changes in the transistor chains 24, 81 and 62, and 24, 71, 61. The bias at the differential amplifier 60 thus remains substantially constant so that temperature variations exert no effect upon the output voltages it develops.

Consider, next, a change in the source potential applied to the contact area 15. This causes the 2.2 volts developed at the emitter electrode of the voltage supply transistor 24 to change by an amout $\Delta V$. Because symmetrical drive is used for the differential amplifier transistor 61 and 62, however, any resulting disturbance produced at the base electrode of one is offset by an equal disturbance at the base electrode of the other. Balanced operation once again results, and the differential amplifier output voltages remained unchanged.

As was previously mentioned, a 47.25 mHz. absorption trap 100 is coupled in the input circuit of the buffer amplifier stage 30. This trap is included to prevent a strong adjacent channel sound signal from capturing the limiter amplifier 30 in the presence of a weaker, mistuned 45.75 mHz. intermediate frequency signal. Although a strong adjacent sound signal would produce substantially no error voltage if the resonant trap were omitted, it being outside the 1 mHz. pull-in range of the apparatus, by so capturing the amplifier 30, it would suppress any weaker, mistuned 45.75 mHz. signal of interest and any error voltage tending to be produced thereby.

The automatic frequency control action may be summarized as follows. If any difference exists between the sampled video carrier intermediate frequency and the 45.75 mHz. reference frequency of the transformer 106, opposite polarity signal phase shifts are developed at the inputs to the detector networks 40 and 50. These phase shifts produce equal and opposite voltage changes at the output terminals of the differential amplifier 60, with the extent and direction of these changes from an initial plus 5 volt value at center frequency being determined by the character of the respective phase shift. The output voltage(s) from the amplifier 60 is (are) coupled to a voltage responsive capacitance coupled to the local oscillator of the television tuner, to adjust its capacity and thereby alter the local oscillator frequency so as to vary the intermediate frequency signal in a direction opposite to the original frequency error that existed from mistuning. The AFC apparatus and the variable capacitance network thus combine to maintain the generation of a 45.75 mHz. video carrier and 41.25 mHz. sound carrier to ensure accurate reproduction of the picture and sound information in the received television signal.

In cases of signal interference or reception of an extremely weak station, it may be desirable to fine tune the local oscillator manually. Such control is generally required also in setting up a detented or pre-programmed channel selector in the television receiver. For VHF operations, the automatic frequency control action provided by the apparatus of FIGURE 1 may be defeated by short circuiting the terminals 110 and 111 by means of a switch 350. For UHF operations, the automatic control may be defeated by short circuiting to a plus 5 volt reference supply, the terminals 110 or 111 supplying the error voltage to the variable reactance circuitry in the local oscillator. The fine tuning can then be accomplished in either mode of operation by manually varying a local oscillator reactance in a known manner. The automatic fine tuning control is reinstated upon removal of the respective short circuits.

Such a 5 volt supply as referred to above may also be constructed on the monolithic chip 10. It is shown in FIGURE 1 by the notation 90, and includes transistors 91 and 92 and resistors 93, 94 and 95. The collector electrode of transistor 91 is connected to the potential source contact 15 through the resistor 93 while the collector electrode of transistor 92 is directly connected to that contact area. The emitter electrodes of these transistors are each referenced to ground, the emitter electrode of transistor 91 by means of the resistor 94 and the emitter electrode of transistor 92 via the resistor 95. The base electrode of transistor 91 is connected to the emitter electrode of transistor 92, and the base electrode of transistor 92 is connected to the collector electrode of transistor 91. The emitter electrode of transistor 92 is also coupled via a contact area 9 to the supply output terminal 113.

The supply 90 develops a 5.0 volt output at the emitter electrode of transistor 92. In general, however, the voltage developed with be equal to one-half the value of the potential applied to the contact area 15. The voltage developed, furthermore, will continue at this one-half value, independent of temperature variations. A voltage supply of this type is more fully described in the pending application Ser. No. 510,307, filed Nov. 29, 1965, and entitled "Electrical Circuit."

It will be appreciated that the automatic frequency control provided by the apparatus of FIGURE 1 may further be defeated by biasing off either or both of the transistors 31 and 32 in the amplifier 30. Because of the circuit symmetry employed, no differential voltages will be applied to the base electrodes of the transistors 61 and 62. The collector electrodes of these transistors will thus each be at the 5 volt initial reference. This method applies both to VHF and UHF control, in which regard it will be noted that the latter no longer requires the 5 volt supply 90.

The automatic frequency control apparatus of the invention has also been constructed using a modified voltage supply unit and modified coupling from the detector networks to the differential amplifier. Such an arrangement is shown in FIGURE 2 of the drawings wherein similar notations are used to identify corresponding components of the apparatus of FIGURE 1. It will be noted that a voltage supply diode 23 and the emitter follower coupling networks 70 and 80 have been omitted. With the arrangement of FIGURE 2, approximately plus 1.5 volts is developed at the emitter electrode of the voltage supply transistor 24. Temperature compensation is again afforded by the base-emitter junctions of transistors 24, 61 and 62, whose voltage drops vary with temperature in a manner to offset similarly produced changes in the voltages developed across the diodes 21 and 22. The control action provided by the apparatus of FIGURE 2 is substantially similar to that provided by the apparatus.

Figures 3, 4, 5A, 5B:
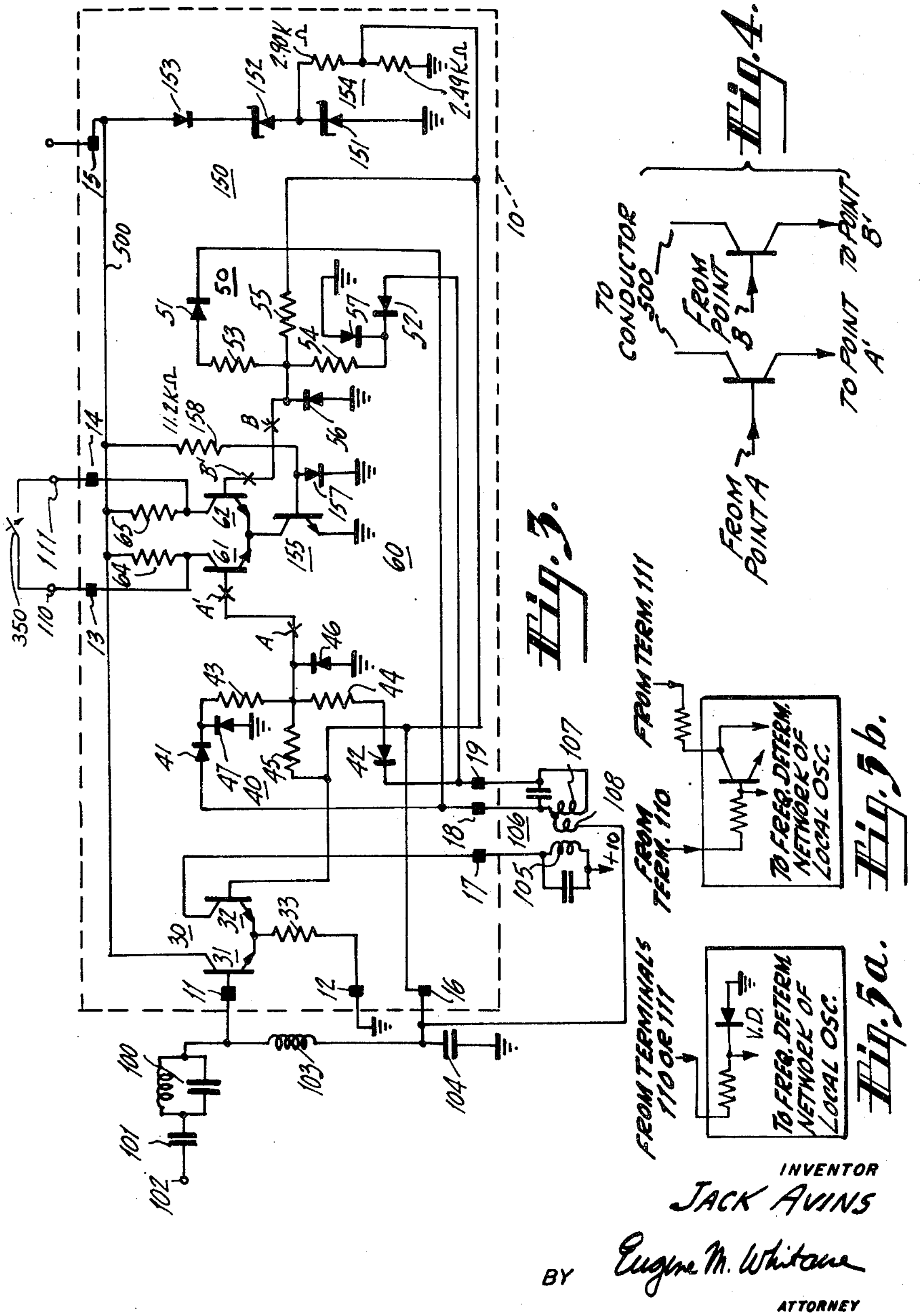
FIGURE 3 is a schematic circuit diagram of a further modification of the automatic frequency control circuitry of FIGURE 1.
FIGURE 4 represents a pair of transistors which may additionally be included in the circuitry of FIGURE 3.
FIGURES 5*a* and 5*b* represent partial block diagrams, helpful in an understanding of the present invention.

The automatic frequency control apparatus of FIGURE 3 also employs a modified voltage supply unit and a modified coupling from the detector networks to the differential amplifier. More particularly, the unit 20 is replaced by an internally regulated supply 150 and the emitter follower coupling circuits 70 and 80 have been omitted. The supply 150 includes a pair of 5 volt Zener diodes 151 and 152 serially coupled with a junction diode 153 between the contact area 15 and ground. A resistive voltage divider 154 is coupled across the Zener 151 to provide substantially the same 2.2 volts previously used in the arrangement of FIGURE 1 to bias the buffer amplifier 30 and the differential amplifier 60. The inclusion of the diode 153 extends the range of control voltages developed at the output terminals 110 and 111. It does so by adding an additional 0.7 volt drop to that provided by the Zener diodes 151 and 152, and thereby increasing the possible voltage swing at the contact areas 13 and 14. The diode 153 thus extends the pull-in range of the apparatus as determined by the voltage responsive capacity device.

The configuration of FIGURE 3 further employs a constant current transistor 155 in place of the common emitter resistor 63 of the differential amplifier 60. A diode 157 couples the base electrode of the transistor 155 to ground to provide temperature stabilization in a known manner. A resistor 158 additionally couples that base electrode to the contact area 15. Such an arrangement is desirable because it makes possible the obtaining of a stable, temperature independent reference voltage for disabling the automatic fine tuning control. Such an arrangement is also desirable in that it simplifies the temperature compensation previously provided by the transistor chains 24, 81, 62 and 24, 71, 61 in FIGURE 1, in combination with the diodes 21, 22 and 23.

As was previously mentioned with respect to the apparatus of FIGURE 1, the automatic fine tuning control can be defeated on VHF operation by short circuiting the error voltage output terminals 110 and 111. Such an approach still applies in the arrangement of FIGURE 3. Defeat of the automatic control on UHF operation, however, can also be accomplished in this manner. It will be understood that this approach is to be taken in the FIGURE 3 arrangement. The reference voltage supply 90 used in disabling the automatic fine tuning on UHF in FIGURE 1 can thus be omitted from the circuit of FIGURE 3 since a corresponding 5 volt potential will nominally be developed at terminals 110 and 111 when short circuited.

Besides the advantages of simplified temperature compensation and automatic fine tuning disable, the apparatus of FIGURE 3 offers other desirable features. One such feature is an improved pull-in characteristic on UHF while another is an increased smoothness in manual tuning.

Consider, first, the improved pull-in feature. It will be appreciated that production variations in the circuit of FIGURE 1 may well cause the X axis of the frequency discriminator characteristic measured at the terminals 110 and 111 to be at a voltage different from that of the reference supply 90. Since that reference voltage is used in manually setting up the local oscillator of the receiver on UHF, any difference in voltage at the terminal used to supply the single ended control voltage after the automatic control disable is removed would be interpreted as an error voltage indicating some degree of mistuning. The apparatus of FIGURE 1 would operate to adjust the local oscillator frequency in response, but would do so at the expense of the possible pull-in range. A one volt difference, for example, might be compensated in a manner to cause the effective pull-in range to decrease from 1 mHz. to 500 kHz. However, with the UHF reference voltage formed by short circuiting terminals 110 and 111 as in the arrangement of FIGURE 3, the pull-in range tends not to be so restricted because both the error and reference voltages tend to depart from the nominal 5 volt value by the same amount.

It will be noted, in addition, that the reference voltage obtained by short circuiting terminals 110 and 111 is stabilized in the presence of temperature variations by the temperature compensated constant current transistor 155. This, together with the fact that the constant current transistor 155 makes the biasing of the differential amplifier transistors 61 and 62 less critical, also results in an improvement in the pull-in characteristic of the control apparatus.

Consider, next, the increased smoothness in manual tuning. With the resistor 63 included in the common emitter circuits of the differential amplifier transistors 61 and 62 in FIGURE 1, it has been observed that the reference voltage obtained at the terminals 110 and 111 when short circuited tended to decrease the degree of mistuning. At 1 mHz. off center frequency, for example, the reference voltage might be down from the nominal 5 volt level to approximately 4 volts. Simultaneous with the tuning of the local oscillator towards the center frequency, then, in the development of a reference voltage of increasing value. This increase gives an uneven feel to the vernier fine tuning control as it is being adjusted. With the constant current transistor 155 substituted for the common emitter resistor 63, however, as in the apparatus of FIGURE 3, a smoother and more even feel to the tuning results because the reference voltage obtained by short circuiting the terminals 110 and 111 is unaffected by variations in the drive of the discriminator transformer 106.

A pair of Darlington connected transistors may also be included in the automatic control apparatus of FIGURE 3 to improve its sensitivity. These transistors, together with the manner of their connections to the circuit of FIGURE 3, are shown in FIGURE 4. As shown, the transistors couple the detector circuits 40 and 50 to their respective differential amplifier input electrodes in much the same manner as do the emitter follower coupling circuits 70 and 80 of FIGURE 1. The balanced circuit arrangement continues to provide its own stable reference voltage, as in FIGURE 3, when terminals 110 and 111 are short circuited. This applies whether the reference voltage so developed at those terminals is to be applied in push-pull fashion to defeat the automatic fine tuning control (VHF) or is to be applied as a single ended disabling voltage (UHF).

Two important factors should be noted with respect to the automatic frequency control apparatus of FIGURES 1 through 4. First, circuit symmetry is employed in each to balance the critical elements of the apparatus. For example: (a) symmetrical, oppositely poled detector networks are used to provide the push-pull signals to the balanced differential amplifier; (b) the detector networks are driven from a common phase shift circuit and are equally loaded thereby; (c) the detector networks and the differential amplifier share a common bias supply; and (d) the output potentials of both halves of the differential amplifier are temperature compensated. Second, the ratios of the resistors are more important to the maintenance of stability than their absolute values. This is of special significance in integrated circuit fabrication since the resistors can all be formed at the same time and their ratios readily maintained, whereas the absolute resistance values are a function of the variables in the fabrication processes. Accordingly, with a given process procedure and with the high dependence placed on circuit symmetry and maintenance of resistor ratios, yields of useable circuits upwards of 98% have been obtained.

While the AFC apparatus of the drawings have been described as employing a common frequency discriminator transformer, it will be apparent that other phase shift devices could be used as well. Quartz crystal filters and solid state piezoelectric devices, for example, are also capable of converting frequency variations into changes in amplitude, and may be used. Arrangements which do not use a phase shift device to drive the detector networks 40 and 50 in common, but use instead a pair of such devices, are less desirable in that they may cause asymmetrical loading of the detector networks 40 and 50, and a resulting imbalance in the operation of the differential amplifier 60. It will also be apparent that the type of voltage responsive, variable capacity device used in the VHF and UHF oscillators will determine whether push-pull or single ended voltages are needed to effect the frequency control function provided by the apparatus of FIGURES 1–4. Where both devices are varactor diodes, for example, only single ended control voltages need be supplied.

What is claimed is:

1. Frequency sensitive apparatus for providing direct voltage indications of the frequency deviation of supplied input signal waves from a predetermined reference frequency, comprising:

a differential amplifier having a pair of input terminals and a pair of output terminals;

means for supplying said input signal waves;

means including first and second detector networks responsive to said signal waves for coupling opposite polarity signals to said pair of differential amplifier input terminals, the amplitudes of which are proportional to the difference in frequency between said waves and said reference frequency;

and means coupled to said pair of differential amplifier output terminals for deriving said direct voltage frequency deviation indications.

2. Frequency discriminating apparatus comprising:

a differential amplifier having a pair of input terminals and a pair of output terminals;

first and second oppositely poled detector networks, each having an output terminal coupled to one of said pair of differential amplifier input terminals;

means for supplying input signal waves having frequencies within a band including a predetermined reference frequency;

and a phase shift circuit tuned to said reference frequency and responsive to said signal waves for providing signals to said first and second detector networks which are shifted in phase with respect to said signal waves by an amount proportional to the frequency deviation of said waves from said reference frequency;

the apparatus being so constructed and arranged that direct signal voltages proportional to said frequency deviation are developed at said pair of differential amplifier output terminals.

3. Frequency discriminating apparatus as defined in claim 2 wherein said first and second detector networks are symmetrically balanced networks, and provide direct signal voltages at said differential amplifier output terminals which are equal in amplitude and opposite in polarity.

4. Frequency discriminating apparatus as defined in claim 3 wherein said phase shift circuit includes a frequency discriminator transformer having primary and secondary windings tuned to said reference frequency, with said primary winding being coupled to receive said input signal waves and with said secondary winding being coupled to apply said phase shifted signal to said first and second detector networks.

5. Frequency discriminating apparatus as defined in claim 4 wherein said first and second detector networks each include a pair of diodes coupled to said secondary winding and a pair of resistors coupled to said diodes to form a series circuit therewith and with at least a portion of said secondary winding.

6. Frequency discriminating apparatus as defined in claim 5 wherein said pair of resistors are serially connected between the cathode electrode of one of said detector network diodes and the anode electrode of the other of said same detector network diodes, and wherein the junction between said pair of resistors comprises the output terminal of each detector network.

7. Frequency discriminating apparatus as defined in claim 6 wherein said frequency discriminator transformer also includes a tertiary winding coupled between a tap on the secondary winding of said transformer and a source of direct current potential, and wherein said first and second detector networks each include a third resistor connected between its respective output terminal and said source of potential

8. Frequency discriminating apparatus as defined in claim 5 wherein there is also included a source of bias potential and wherein said first and second detector networks respectively couple one of said pair of differential amplifier input terminals to said source of potential.

9. Frequency discriminating apparatus as defined in claim 6 wherein said differential amplifier includes first and second transistors, and wherein said apparatus also includes a source of bias potential for said transistors comprising:

a source of operating potential;

fifth and sixth serially connected diodes;

fifth and sixth resistors respectively coupling the anode electrode of said fifth diode to said source of potential and the cathode electrode of said sixth diode to a point of reference potential;

and a third transistor connected in an emitter follower configuration, with the base electrode of said third transistor coupled to the anode electrode of said fifth diode and with the emitter electrode of said third transistor direct current coupled to the base electrodes of said first and second transistors.

10. Frequency discriminating apparatus as defined in claim 6 wherein said differential amplifier includes first and second transistors, and wherein said apparatus also includes a source of bias potential for said transistors comprising:

a source of operating potential;

fifth, sixth and seventh serially connected diodes;

fifth and sixth resistors respectively coupling the anode electrode of said fifth diode to said source of potential and the cathode electrode of said seventh diode to a point of reference potential; and third, fourth and fifth transistors, each connected in an emitter follower configuration, with the base electrode of said third transistor coupled to the anode electrode of said fifth diode and with the emitter electrode of said third transistor direct current coupled to the base electrodes of said fourth and fifth transistors, the emitter electrode of said fourth and fifth transistors being direct current coupled to the base electrodes of said first and second transistors.

11. Frequency discriminating apparatus as defined in claim 6 wherein said first and second detector networks each include a third diode connected to its respective output terminal, and means for reverse biasing said third diode.

12. Frequency discriminating apparatus as defined in claim 6 wherein said first and second detector networks each include a third diode connected to the junction of one of said pair of detector network resistors with the cathode electrode of said one detector network diode, and means for reverse biasing said third diode.

13. Frequency discriminating apparatus as defined in claim 7 wherein: (a) said first and second detector networks each include third and fourth diodes connected to its respective output terminal and to the junction of one of said pair of resistors with the cathode electrode of said one detector network diode respectively; (b) means are additionally included for reverse biasing said first and second detector network third and fourth diodes; (c) said differential amplifier includes first and second transistors; and (d) said apparatus also includes a source of bias potential for said transistors comprising:

a source of operating potential;

ninth and tenth serially connected diodes;

seventh and eighth resistors respectively coupling the anode electrode of said ninth diode to said source of potential and the cathode electrode of said tenth diode to a point of reference potential;

and a third transistor connected in an emitter follower configuration, with the base electrode of said third transistor coupled to the anode electrode of said ninth diode and with the emitter electrode of said third transistor providing said source of direct current potential for said tertiary winding and said third resistor of each detector network, the emitter electrode of said third transistor being direct current coupled to the base electrodes of said first and second transistors.

14. Frequency discriminating apparatus as defined in claim 13 wherein said differential amplifier, said first and second detector networks and said source of bias potential are all disposed in a single integrated circuit.

15. Frequency discriminating apparatus as defined in claim 7 wherein: (a) said first and second detector networks each include third and fourth diodes connected to its respective output terminal and to the junction of one of said pair of resistors with the cathode electrode of said one detector network diode respectively; (b) means are additionally included for reverse biasing said first and second detector network third and fourth diodes; (c) said differential amplifier includes first and second transistors; and (d) said apparatus also includes a source of bias potential for said transistors comprising:

a source of operating potential;

ninth, tenth and eleventh serially connected diodes;

seventh and eighth resistors respectively coupling the anode electrode of said ninth diode to said source of potential and the cathode electrode of said eleventh diode to a point of reference potential; and third, fourth and fifth transistors, each connected in an emitter follower configuration, with the base electrode of said third transistor coupled to the anode electrode of said ninth diode and with the emitter electrode of said third transistor direct current coupled to the base electrodes of said fourth and fifth transistors, providing said source of direct current potential for said tertiary winding and said third resistor of each detector network, the emitter electrodes of said fourth and fifth transistors being direct current coupled to the base electrodes of said first and second transistors.

16. Frequency discriminating apparatus as defined in claim 15 wherein said differential amplifier, said first and second detector networks and said source of bias potential are all disposed in a single integrated circuit.

17. For use in a television receiver of the type wherein undesired variations of a local oscillator frequency produce deviations of a video carrier signal wave in the intermediate frequency band from a predetermined reference frequency, apparatus comprising:

a differential amplifier having a pair of input terminals and a pair of output terminals;

first and second oppositely poled detector networks, each having an output terminal coupled to one of said pair of differential amplifier input terminals;

means for supplying said video carrier signal waves within said intermediate frequency band; and frequency discriminator transformer means tuned to said reference frequency and responsive to said signal waves for providing signals to said first and second detector networks which are shifted in phase with respect to said signal waves by an amount proportional to the difference in frequency between said wave and said reference frequency;

the apparatus being so constructed and arranged that direct signal voltages proportional to said frequency deviations are developed at said pair of differential amplifier output terminals, which, when coupled to a voltage responsive reactance device included in the frequency determining network of said local oscillator, vary the frequency of said oscillator in a direction opposite to said undesired variations.

18. Apparatus as defined in claim 17 wherein said transformer means includes a frequency discriminator transformer having primary and secondary windings tuned to said reference frequency, with said primary winding being coupled to receive said video carrier signal waves and with said secondary winding being coupled to apply said phase shifted signals to said first and second detector networks, and wherein the range of video carrier frequency deviations over which said direct current signal voltages exert control over said local oscillator frequency is established by the Q of said discriminator transformer.

19. Frequency discriminating apparatus as defined in claim 1 wherein one of said output terminals provides a single ended control voltage and both of said output terminals provide a source of reference potential when connected together.

20. Frequency discriminating apparatus as defined in claim 19 wherein said reference potential is of a value substantially corresponding to said single ended control voltage at zero frequency deviation of said signal waves from said reference frequency.

21. Frequency discriminating apparatus as defined in claim 19 wherein said reference potential remains at a substantially constant value independent of the frequency deviation between said input signal waves and said reference frequency.

22. Frequency discriminating apparatus as defined in claim 19 wherein said first and second detector networks each have an output terminal coupled to one of said pair of differential amplifier input terminals and wherein there is additionally included a phase shift circuit tuned to said reference frequency and responsive to said input signal waves for providing signals to said first and second detector networks which are shifted in phase with respect to said signal waves by an amount proportional to the frequency deviation of said waves from said reference frequency.

23. Frequency discriminating apparatus as defined in claim 6 wherein said differential amplifier includes first and second transistors, and wherein said apparatus also includes a source of bias potential for said transistors comprising:

a source of operating potential;

first and second Zener diodes serially coupled in the order named between said source of potential and a point of reference potential;

and fifth and sixth resistors forming a voltage divider connected across said second Zener diode, with the junction of said fifth and sixth resistors direct current coupled to the base electrodes of said first and second transistors.

24. Frequency discriminating apparatus as defined in claim 6 wherein said differential amplifier includes first and second transistors, and wherein said apparatus also includes a source of bias potential for said transistors comprising:

a source of operating potential;

first and second Zener diodes serially coupled in the order named between said source of potential and a point of reference potential;

fifth and sixth resistors forming a voltage divider connected across said second Zener diode;

and third and fourth transistors, each connected in a Darlington configuration, with the junction of said fifth and sixth resistors being direct current coupled to the base electrodes of said third and fourth transistors and with the emitter electrodes of said third and fourth transistors being direct current coupled to the base electrodes of said first and second transistors.

25. Frequency discriminating apparatus as defined in claim 7 wherein: (a) said first and second dectector networks each include third and fourth diodes connected to its respective output terminal and to the junction of one of said pair of resistors with the cathode electrode of said one detector network diode respectively; (b) means are additionally inclined for reverse biasing said first and second detector network third and fourth diodes; (c) said differential amplifier includes first and second transistors; and (d) said apparatus also includes a source of bias potential for said transistors comprising:

a source of operating potential;

first and second Zener diodes serially coupled in the order named between said source of potential and a point of reference potential;

and fifth and sixth resistors forming a voltage divider connected across said second Zener diode, with the junction of said fifth and sixth resistors providing said source of direct current potential for said tertiary winding and said third resistor of each detector network, the junction of said fifth and sixth resistors being direct current coupled to the base electrodes of said first and second transistors.

26. Frequency discriminating apparatus as defined in claim 25 wherein said differential amplifier, said first and second detector networks and said source of bias potential are all disposed in a single integrated circuit.

27. Frequency discriminating apparatus as defined in claim 7 wherein: (a) said first and second detector networks each include third and fourth diodes connected to its respective output terminal and to the junction of one of said pair of resistors with the cathode electrode of said one detector network diode respectively; (b) means are additionally included for reverse biasing said first and second detector network third and fourth diodes; (c) said differential amplifier includes first and second transistors; and (d) said apparatus also includes a source of bias potential for said transistors comprising:

a source of operating potential;

first and second Zener diodes serially coupled in the order named between said source of potential and a point of reference potential;

fifth and sixth resistors forming a voltage divider connected across said second Zener diode;

and third and fourth transistors, each connected in a Darlington configuration, with the junction of said fifth and sixth resistors being direct current coupled to the base electrodes of said third and fourth transistors, providing said source of direct current potential for said tertiary winding and said third resistor of each detector network, and with the emitter electrodes of said third and fourth transistors being direct current coupled to the base electrodes of said first and second transistors.

28. Frequency discriminating apparatus as defined in claim 27 wherein said differential amplifier, said first and second detector networks and said source of bias potential are all disposed in a single integrated circuit.

29. Frequency discriminating apparatus as defined in claim 22 wherein said differential amplifier includes first and second transistors having a common emitter electrode circuit and a third transistor having its collector-emitter path included within said common emitter circuit.

30. Frequency discriminating apparatus as defined in claim 29 wherein means are included to temperature stabilize said third transistor for causing said third transistor to supply a substantially constant current to said first and second transistors.

31. Automatic frequency control apparatus comprising:

first means, including a local oscillator and a voltage responsive reactance device included in the frequency determining network thereof, for supplying input signal waves having frequencies within a band including a predetermined reference frequency;

second means, including a differential amplifier having a pair of input terminals to which said signal waves are applied and a pair of output terminals, responsive to said input waves for developing direct signal voltages at said output terminals which are proportional to the frequency deviation of said waves from said reference frequency, one of said output terminals providing a single ended control voltage in an enabled differential amplifier mode of operation and both of said output terminals providing a source of reference potential when connected together in a disabled differential amplifier mode of operation;

and third means coupling at least one of said output terminals to said voltage responsive reactance device for causing the direct signal voltages developed thereat to control the reactance of said device in a manner to vary the frequency of said local oscillator in a direction to reduce said frequency deviations in said enabled mode of operation and for causing said reference potential to control the reactance of said device to establish the frequency of said local oscillator at said predetermined reference frequency in said disabled mode of operation.

32. Automatic frequency control apparatus as defined in claim 31 wherein said voltage responsive reactance device comprises a varactor diode and wherein said third means couples said one output terminal to said varactor diode to vary its reactance in response to said direct signal voltages.

33. Automatic frequency control apparatus as defined in claim 31 wherein said voltage responsive reactance device comprises a transistor having an open circuited emitter electrode, and wherein said third means respectively couples both of said output terminals to the collector and base electrodes of said transistor to vary its reactance in response to said direct signal voltages.

References Cited

UNITED STATES PATENTS

| | | | |
|---|---|---|---|
| 3,098,981 | 7/1963 | Foster et al. | 331—177 |
| 3,353,117 | 11/1967 | Renkowitz | 332—30 |
| 2,536,804 | 1/1951 | Goldberg et al. | 331—149 |
| 3,010,073 | 11/1961 | Melas | 331—1 |

JOHN KOMINSKI, *Primary Examiner.*

U.S. Cl. X.R.

178—7.2, 69.5; 330—14, 30; 331—20, 27, 32